United States Patent [19]
Weaver et al.

[11] Patent Number: 6,117,352
[45] Date of Patent: Sep. 12, 2000

[54] REMOVAL OF A HEAT SPREADER FROM AN INTEGRATED CIRCUIT PACKAGE TO PERMIT TESTING OF THE INTEGRATED CIRCUIT AND OTHER ELEMENTS OF THE PACKAGE

[75] Inventors: Kevin Weaver, San Jose; Steve E. Scott, Los Gatos, both of Calif.

[73] Assignee: LSI Logic Corporation, Milpitas, Calif.

[21] Appl. No.: 08/975,025

[22] Filed: Nov. 20, 1997

[51] Int. Cl.$^7$ ........................................................ B44C 1/22
[52] U.S. Cl. ............................ 216/105; 216/106; 216/108
[58] Field of Search ..................................... 216/105, 106, 216/108

[56] References Cited

PUBLICATIONS

Alpha Metals Brochure; "Flip Chip 1,2,3: Bump, Band, Fill" 1996.

*Primary Examiner*—Edward J. Cain
*Attorney, Agent, or Firm*—Conley Rose & Tayon

[57] ABSTRACT

The present invention advantageously provides a method for obtaining access to an integrated circuit chip encapsulated within a device package. The present method involves positioning a masking material, i.e., gasket, adjacent to the heat spreader of the device package. The gasket includes a cavity which is aligned adjacent a portion of the heat spreader directly above the chip. An etchant injection system is then placed against the gasket. A heat spreader etchant is then injected directly into the cavity such that the etchant contacts the exposed surface of the heat spreader. The etchant is supplied to the cavity until a opening is etched vertically through the thickness of the heat spreader. If the heat spreader is composed of copper plated with nickel, it is preferred that the etchant be a solution of 70% nitric acid heated to about 80° C. Formation of the opening through the heat spreader may expose an adhesive layer. This layer may be removed using abrasion combined with nitric acid solution to expose the underside of the chip.

17 Claims, 2 Drawing Sheets

REMOVAL OF A HEAT SPREADER FROM AN INTEGRATED CIRCUIT PACKAGE TO PERMIT TESTING OF THE INTEGRATED CIRCUIT AND OTHER ELEMENTS OF THE PACKAGE

BACKGROUND OF THE INVENTION

1. Field of the Invention

This invention relates to semiconductor device packages and, more particularly, to removing a heat spreader from above an integrated circuit chip encapsulated within a device package to expose the chip and the inside of the package for reliability and failure analysis testing.

2. Description of the Related Art

During integrated circuit manufacturing, a large number of identical integrated circuit devices (e.g., a microprocessor) are typically produced upon a unitary silicon substrate in an array of rectangular elements called "dice". Signals lines which are formed upon the silicon substrate for each individual device are terminated at flat metal contact regions called input/output (I/O) pads. The signal lines are to be connected to external devices. Following manufacture, the substrate is sliced into individual dice or chips, and each chip is secured within a protective semiconductor device package. The role of the package is to provide mechanical support, electrical connection, protection, and heat removal for the die. Each I/O pad of the chip is connected to one or more terminals of the device package. The terminals of a device package are typically arranged about the periphery of the package. Fine metal wires may be used to connect the I/O pads of the chip to the terminals of the device package. Some types of device packages have terminals called "pins" for insertion into holes in a printed circuit board (PCB). Other types of device packages have terminals called "leads" for attachment to flat metal contact regions on an exposed surface of a PCB.

The controlled collapse chip connection ("C4") is a well known method of attaching an integrated circuit chip directly to a PCB, and is commonly referred to as the "flip chip" method. In preparation for C4 attachment, the I/O pads of the chip are arranged in a two-dimensional array upon an underside of the chip, and a corresponding set of bonding pads are formed upon an upper surface of the PCB. A solder ball (or bump) is formed upon each of the I/O pads of the chip. During C4 attachment of the chip to the PCB, the solder balls are placed in physical contact with the bonding pads of the PCB. The solder balls are then heated long enough for the solder to flow. When the solder cools, the I/O pads of the chip are electrically and mechanically coupled to the bonding pads of the PCB. After the chip is attached to the PCB, the region between the chip and the PCB is filled with an "underfill" material which encapsulates the C4 connections and provides other mechanical advantages.

A ball grid array ("BGA") device package includes a chip mounted upon a larger substrate made of, for example, fiberglass-epoxy printed circuit board material or a ceramic material (e.g., aluminum oxide, alumina, or aluminum nitride). FIG. 1 depicts a an exemplary BGA device package 10. The substrate 14 includes two sets of bonding pads: a first bonding pad set 16 adjacent to the chip 12 and a second bonding pad set 18 arranged in a two-dimensional array across the underside surface of the device package 10. The I/O pads 20 of the chip 12 are typically connected to corresponding members of the first bonding pad set 16 via solder bumps 22 using the C4 technique described above. One or more layers of signal lines (i.e., interconnects) of the substrate 14 connect respective members of the first and second sets of bonding pads. Members of the second bonding pad set 18 are coated with solder, forming solder ball terminals 24. A stiffener 26 may be attached to the perimeter of the upper surface of substrate 14 by a first adhesive layer 28. Stiffener 16 helps maintain the substantially planar shape of substrate 14 during and after C4 heating of solder bumps 22.

A heat spreader 30 is also attached to the upper surface of substrate 14 by a second conductive adhesive layer 32, and a thermally conductive adhesive layer 34 is interposed between chip 12 and heat spreader 30. Heat spreader 30 may be composed of copper which exhibits high thermal conductivity. During operation, semiconductor devices (e.g., integrated circuit chips) dissipate electrical power, transforming electrical energy into heat energy. Heat spreader 30 permits the heat energy produced by chip 12 to be removed to the ambient environment at a rate which ensures operational and reliability requirements are met. Otherwise, the temperature of chip 12 might exceed a specified operating temperature, resulting in irreversible damage to the chip.

After a chip is packaged, it may undergo testing to identify any device damage that may have occurred during the assembly of the package. Moreover, certain elements of device performance, such as speed, can only be measured in the completed package. For some devices, final testing may be preceded by a "burn-in" in which the device is operated for a period of time under stress. Such devices are then tested to determine if performance of the devices is still acceptable. Various types of failure mechanisms can occur. For example, the chip passivation layer which is usually made of brittle glass films may crack. Metallization on the chip may deform as a result of shear stresses between the package elements and the chip. Voids and cracks may also occur in the package itself. Adhesive layers between the chip and the package may undergo delamination. Various types of tests are used to perform failure analysis of a chip and its package. For example, infrared absorption spectroscopy and emission spectroscopy may be used to analyze the underside surface of the chip for fault localization. Acoustic microscopy may be used to determine if any delaminations or voids exist in e.g., adhesion layers of the package. Whatever testing mechanism is used, it is oftentimes necessary to characterize failures post-packaging.

Before performing failure analysis of a chip and its package, access to the chip and the inside of the package must be obtained. Conventional techniques for gaining access to a chip packaged according to FIG. 1 involve removal of the heat spreader 30 from the package 10. Unfortunately, current methods for heat spreader removal are problematic. As shown in FIG. 1, one method involves inserting a sharp, thin object, e.g., a razor blade underneath heat spreader 30 at e.g., point 29 such that the razor blade can function as a lever. The heat spreader 30 is then mechanically pried from chip 12 and stiffener 26 by applying an upward force to one end of the razor blade, thereby causing the other end of the razor blade to apply a downward force on the underlying package and chip. Stress (compressive and shear) caused by the physical lever action may disrupt the chip relative to the package and/or force the package and/or chip into a nonplanar ("warped") state.

FIG. 2 depicts another technique which is often used to remove heat spreader 30 from package 10. The entire package 10 may be placed in a container 36 which is filled with a ferric chloride solution. The ferric chloride solution is maintained at a temperature which permits etching of the heat spreader, the heat spreader being composed of nickel plated copper. Unfortunately, the ferric chloride solution can also etch the stiffener 26 and the solder ball terminals 24 which are composed of tin and lead. Absence of solder ball terminals 24 makes electrical testing of the chip impossible since the I/O pads of the chip (i.e., the chip circuits) are electrically linked to the solder ball terminals 24. Further, this process is time consuming. Etching of nickel is relatively slow, and the etched materials must be carefully cleaned from the chip and package so as not to skew the failure analysis test.

Yet another method used to remove heat spreader 30 from package 10 is illustrated in FIG. 3. A shearing tool 40 is positioned such that a cavity at the base of the tool surrounds the top and sides of heat spreader 30. Heat is applied to heat spreader 30 while a handle attached to the top of shearing tool 40 is rotated in a clockwise or counterclockwise direction about axis 41. As a result, adhesive layers can no longer hold heat spreader 30 against stiffener 26 and chip 12, and the heat spreader 30 is sheared from package 10. The shear stress between heat spreader 30 and stiffener 26/chip 12 that occurs during removal of the heat spreader may lead to physical damage, such as delaminations in the package layers or cracks in the chip. Both mechanical heat spreader removal techniques which are shown in FIGS. 1 and 3 can lead to inconclusive failure analysis results. It may be impossible to determine whether a device or package was damaged during fabrication and packaging or during heat spreader removal.

It would therefore be desirable to devise a technique for providing access to the chip and the inside of the package without damaging the chip and without removing necessary components required for testing of the chip and package. A technique is needed which removes the heat spreader from above the chip to expose the chip without warping, cracking, or delaminating layers of the chip and its package and/or various package components. It would also be beneficial if removal of the solder ball terminals is prevented so that electric testing of the chip may be performed. A technique having these qualities would allow one to pinpoint failure mechanisms that occur during assembly of the chip and the package using failure analysis results.

SUMMARY OF THE INVENTION

The problems outlined above are in large part solved by the technique hereof for removal of a heat spreader from a semiconductor device package. The present invention advantageously provides a method for etching an opening exclusively through the heat spreader to expose the underside surface of an underlying integrated circuit chip. A masking material is positioned upon the exposed surface of the heat spreader which covers all portions of the heat spreader except that which is to be etched. The masking material includes a cavity aligned above the chip into which a heat spreader etchant may be injected. The heat spreader etchant may be any substance which substantially etches the material from which the heat spreader is made. The masking material is preferably substantially resistant to attack by the heat spreader etchant, and thus prevents the heat spreader etchant from contacting select portions of the heat spreader. Further, the heat spreader etchant is injected into the cavity. The heat spreader etchant preferably exhibits high selectivity to the heat spreader material and does not readily attack other elements of the device package. In this manner, removal of essential elements of the device package, such as the solder ball terminals and the underfill material is inhibited. Further, the problems associated with mechanical removal of the heat spreader from the package are prevented.

In one embodiment, an integrated circuit chip is positioned within a BGA device package. The device package includes a substrate, a heat spreader, and a stiffener. The substrate includes a first set of bonding pads (i.e., electrical contacts) on an upper surface and a second set of bonding pads on an opposed underside surface. The first set of bonding pads are vertically aligned with corresponding members of the I/O pads of the chip. The chip is mounted upon the substrate via solder bumps which are electrically and mechanically linked to bonding pads of the substrate and I/O pads of the chip. The substrate further includes multiple layers of patterned electrical conductors which couple together members of the first set of bonding pads to corresponding members of the second set of bonding pads. The stiffener, a substantially rigid member able to retain its shape during C4 heating, is attached to the upper surface of the substrate. The stiffener includes an opening near its center which extends from an upper surface to an opposed underside surface. The opening is dimensioned to receive the chip in close proximity to the inner wall, i.e., circuit-facing wall of the stiffener. The heat spreader is attached to the upper surfaces of the chip and the stiffener. The heat spreader is made of a thermally conductive material and functions to quickly transfer heat produced during chip operation to the surrounding environment.

During the heat spreader removal process, a masking material having a cavity disposed at its center is positioned directly adjacent to an exposed horizontal surface of the heat spreader. The cavity is aligned directly above a portion of the heat spreader arranged directly above the chip. The masking material is dimensioned to cover all other portions of the exposed surface of the heat spreader. The cavity is sized to receive and hold a heat spreader etchant in contact with a portion of the heat spreader. Subsequent to positioning of the masking material over the heat spreader, an etchant injector block of an etchant dispense system is placed against the masking material. The block preferably includes a conduit passing therethrough from an etchant supply source to the cavity. Typically, the heat spreader is composed of copper which is plated with nickel. Preferably, the etchant is an approximately 70% solution of nitric acid which selectively etches both copper and nickel. The masking material ("gasket") may be any material which is substantially resistant (i.e., non-selective) to attack by the heat spreader etchant. Preferably, the gasket is neoprene rubber which conforms well to the surface of the heat spreader.

The nitric acid solution may be heated to 80° C. and then pumped through the etchant injector block and into the cavity, preferably at a rate of about 3 $\mu$L/min. As a result, the nitric acid solution contacts a select portion of the heat spreader surface not covered by the rubber gasket. Depending on the thickness of the heat spreader and the rate at which the nitric acid solution etches the heat spreader, the nitric acid solution is injected into the cavity for a preselected period of time. The nitric acid solution may etch the heat spreader at a rate of approximately 0.1 mm/min, and the heat spreader may be about 0.5 mm thick. Accordingly, the nitric acid solution would be supplied to the cavity for about 5 minutes. After the vertical thickness of the heat spreader above the chip has been etched, a thermally conductive interface layer (between the heat spreader and the chip) may be exposed. Removal of this interface layer to expose the underside surface of the chip may be accomplished by applying heated nitric acid to the layer and abrading the layer with e.g., a cotton swab or a wood splint.

Advantageously, the heat spreader etchant passes from the etchant supply source to the cavity while being completely enclosed within an etchant injector block. The etchant injector system thus prevents the etchant from contacting the device package before reaching the heat spreader. Further, the rubber gasket prevents the etchant from contacting regions of the heat spreader against which it is adjacently disposed. As a result, only the material necessary to expose the chip is removed. This method also helps prevent damage to the chip and device package during removal of the heat spreader since no mechanical stresses are created between the heat spreader and the chip or the package. As a result, tests may be performed on the device package and chip to better determine if the technique used to assemble the chip within the package needs improvement.

BRIEF DESCRIPTION OF THE DRAWINGS

Other objects and advantages of the invention will become apparent upon reading the following detailed description and upon reference to the accompanying drawings in which.

Figure 1:
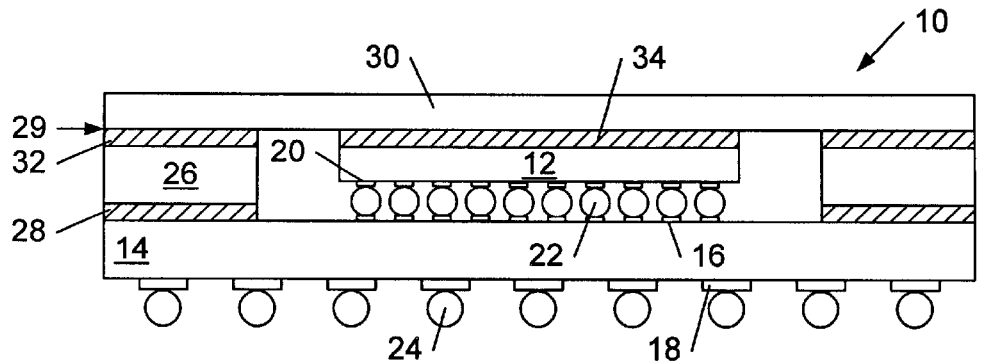
FIG. 1 is a cross-sectional view of an exemplary BGA device package including an integrated circuit chip mounted upon an upper surface of a substrate and a heat spreader attached to the upper surface of the chip, wherein the heat spreader is mechanically pulled away from the device package.
Figure 2:
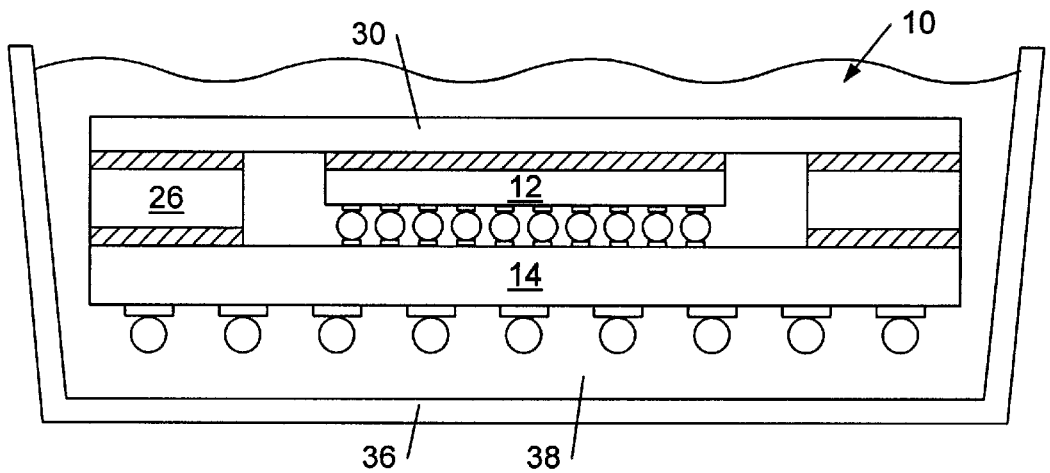
FIG. 2 is a cross-sectional view of the BGA device package, wherein the package is placed in a ferric chloride solution to etch the heat spreader from the device package.
Figure 3:
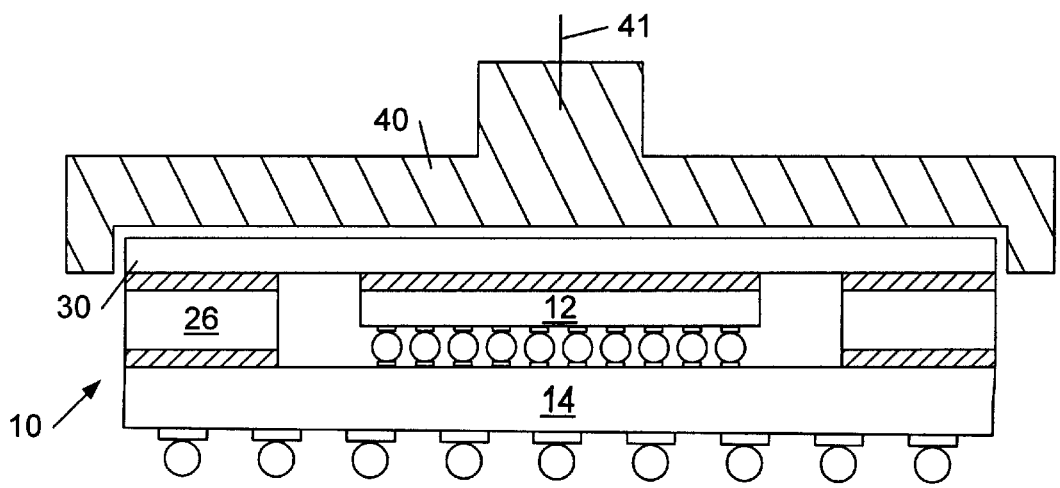
FIG. 3 is a cross-sectional view of the BGA device package, wherein a shearing tool is used to mechanically shear the heat spreader from the device package.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
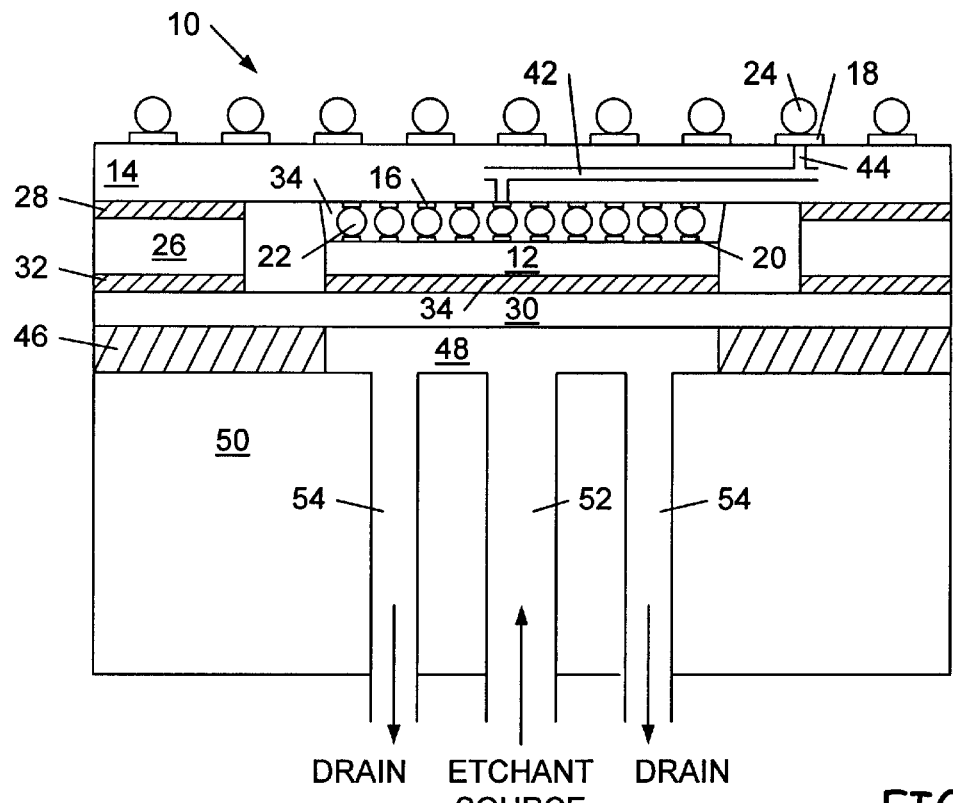
FIG. 4 is a cross-sectional view of a BGA device package, wherein a masking material is positioned adjacent all regions of a heat spreader except a portion of the heat spreader arranged directly above an integrated circuit chip, and a heat spreader etchant is forwarded to that portion of the heat spreader.

Turning to FIG. 4, a BGA device package 10 is provided which encapsulates an integrated circuit chip 12. Device package 10 is depicted in FIG. 4 in an orientation which places the underside surface of chip 12 above the upper surface of chip 12. In other words, device package 10 is flipped upside down. Chip 12 includes one or more electronic devices formed upon a monolithic semiconductor substrate. Chip 12 also includes multiple I/O pads 20 arranged in a two-dimensional array across the underside surface of chip 12. Solder bumps 22 electrically link I/O pads 20 to a first set of bonding pads 16 which are arranged along a surface of a substrate 14. Substrate 14 is preferably composed of fiberglass-epoxy printed circuit board material. Alternately, substrate 14 may be made of, for example, a ceramic material, such as aluminum oxide or aluminum nitride. Chip 12 has been mounted to substrate 14 using the controlled collapse chip connection (C4) or "flip chip" method described above.

In addition to the first set of bonding pads 16, substrate 14 also includes a second set of bonding pads 18 arranged on an opposed surface relative to the surface upon which the first set of bonding pads 20 is arranged. The first and second sets of bonding pads are preferably arranged in two-dimensional arrays. Members of the first set of bonding pads 16 have substantially the same lateral dimensions (i.e., are approximately the same size) as the I/O pads 20 of chip 12 and are configured to align with those I/O pads. The second set of bonding pads 18 may be covered with solder in the form of solder balls 24 which function as terminals of device package 10. Alternately, the second set of bonding pads may have pins extending outwardly therefrom for connecting to a PCB or for inserting into a socket. Substrate 14 also includes one or more patterned horizontal layers of electrically conductive material, i.e., conductors, which are electrically isolated by a dielectric layer of the substrate. The conductors connect members of the first and second sets of bonding pads. In FIG. 4, an exemplary horizontal trace conductor 42 connects a bonding pad of the first set of bonding pads 16 to a bonding pad of the second set of bonding pads 18 with the help of vertical conductive vias 44.

Stiffener 26 is a rigid structure made of a thermally conductive material, preferably a metal (e.g., copper, aluminum or an alloy). Stiffener 26 is dimensioned to substantially cover the upper surface of substrate 14 while surrounding the perimeter, i.e., vertical sides, of chip 12. Stiffener 26 is attached to the upper surface of substrate 14 by a first adhesive layer 28. First adhesive layer 32 may be, for example, a layer of an epoxy. A heat spreader 30 which is preferably made of a highly thermally conductive material, such as copper is attached to the upper surface of stiffener 26 via a second adhesive layer 32. The heat spreader 30 is also preferably coated with nickel to protect the underlying copper from corrosive materials. The heat spreader 30 spans across the upper surface of chip 12 and laterally outward to the periphery of stiffener 26. A thermally conductive adhesive layer 34 made of, (e.g., epoxy or grease) may be disposed at the interface between chip 12 and heat spreader 30.

A thermally conductive C4 underfill material 32 may encapsulate the C4 connections in the space between chip 12 and substrate 14. The C4 underfill material may be, for example, a liquid which becomes substantially rigid (i.e., hardens) during a curing process (e.g., over time or at an elevated temperature). The liquid may be initially dispensed along one or more sides of chip 12, and capillary action may be used to fill the space between the underside of chip 12 and the corresponding portion of the upper surface of substrate 14. A thermal interface layer may fill the space between the chip 12, underfill 34 and stiffener 26. Alternately, the underfill material may fill both the space between the chip and the substrate and the space between the chip and the stiffener. The underfill material (or thermal interface material) which brings the side surfaces of chip 12 into thermal communication with stiffener 26 provides additional thermal paths for heat energy to flow from chip 12 to the ambient via stiffener 26, substrate 14, and heat spreader 30.

According to an embodiment of the present invention, a masking gasket 46 may be positioned adjacent to the heat spreader 30 in preparation for etching of the heat spreader from above chip 12, in proximity to the underside (non-topological) side of chip 12. Gasket 46 includes a cavity 48 which is preferably aligned adjacent to a portion of the heat spreader directly above chip 12. An etchant injection block 50 is then positioned adjacent to gasket 46 such that conduits 52 and 54 of the block terminate at cavity 48. Injection block 50 may belong to an etchant injection system. An etchant injection system may be used to increase the temperature of the heat spreader etchant and pump the etchant through conduit 52 into cavity 48. Gasket 46 is preferably composed of a flexible material which conforms well to the surface of heat spreader 30 and which is substantially resistant to attack by the heat spreader etchant. Since the heat spreader etchant is passed directly from its supply source to cavity 48 while being enclosed within block 50, no etchant can contact other elements of the device package. Thus, removal of e.g., the solder balls 24 by the etchant is prevented.

The spreader etchant may be any substance which etches the material from which the heat spreader 30 is made. Preferably, when the heat spreader 30 is made of copper plated with nickel, a 70% (or greater) aqueous solution of nitric acid is used as the etchant. A 70% nitric acid solution etches both copper and nickel relatively quickly and uniformly. Alternately, a solution of 30% ferric chloride may be used, however, the ferric chloride solution does not etch uniformly and etches nickel slowly. In another embodiment, more than one etchant may be injected into cavity 48 for the purpose of removing heat spreader 30. First, an etchant which etches nickel well, such as a 70% nitric acid solution mixed with acetic acid may be forwarded into the cavity. Then, an etchant which etches copper well, such as a 30% ferric chloride solution may be injected into the cavity. In yet another embodiment, the nickel layer at the surface of heat spreader 30 may be scraped from the copper portion of the heat spreader. An acid injection system may then be used to forward a nitric acid solution to the heat spreader 30 to etch through the copper.

In an embodiment in which the etchant forwarded into cavity 48 is 70% nitric acid, the etchant is heated to a temperature of about 80° C. before it is injected into the cavity 48. The heated nitric acid solution may be pumped into cavity 48 via conduit 52 at a rate of 3 μL/min to ensure that heated etchant is constantly in contact with the portion of heat spreader 30 exposed by opening 48. The etchant may pass out of cavity 48 to a drain via conduits 54. Preferably, gasket 46 is made of neoprene rubber. For example, a Viton type gasket available from B&G Co. in Soquel, Calif. may be used. Gasket 46 prevents the nitric acid solution from contacting regions of heat spreader 30 not masked by gasket 46. The gasket thickness dictates the depth of cavity 48 and thus should be sized such that cavity 48 is large enough to hold a quantity of etchant necessary to continuously etch heat spreader 30. Preferably, gasket 46 is about 2 to 4 mm thick.

The etchant is pumped into cavity 48 for a time period required to etch entirely through the vertical thickness of heat spreader 30. For example, a 70% nitric acid solution may etch the heat spreader material at a rate of approximately 0.1 mm/min, so for a 0.5 mm thick heat spreader, it may take about 5 minutes to etch vertically through the heat spreader. An automatic or semi-automatic acid injection system may be used for the etchant injection. Examples of such acid injection systems are the Nitric Etcher V or the B&G Decapsulator Model 250, both commercially available from B&G, or the PA103 which is available from Icom Co. In Los Angeles, Calif.

Figure 5:
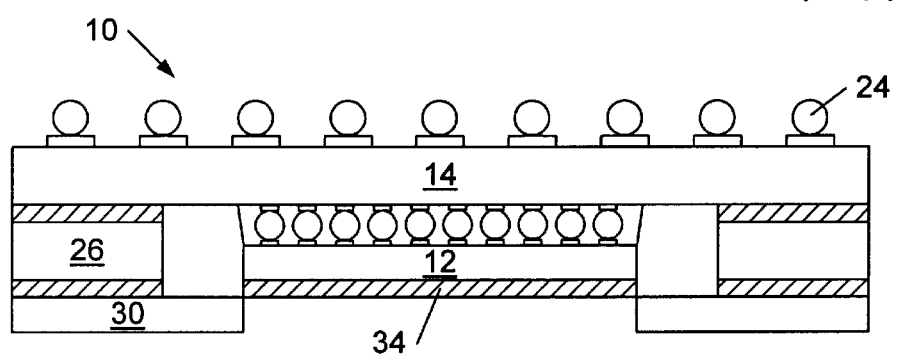
FIG. 5 is a cross-sectional view of the BGA device package, wherein the heat spreader etchant removes a portion of the heat spreader, and thereby exposes a thermally conductive interface layer, as a result of the step depicted in FIG. 4.
Figure 6:
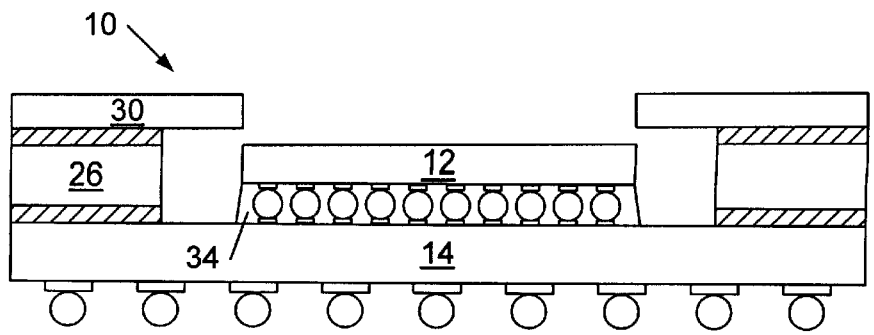
FIG. 6 is a cross-sectional view of the BGA device package, wherein the thermally conductive interface layer is removed, subsequent to the step of FIG. 5.

FIG. 5 illustrates that an opening is etched through heat spreader 30 to expose the thermally conductive adhesive layer 34. Subsequently, device package 10 may be cleaned by rinsing the package with acetone, blowing the package dry with nitrogen, and soaking the package in water. As shown in FIG. 6, the thermally conductive adhesive layer 34 is then removed to expose chip 12. The adhesive layer 34 may be removed by e.g., scrubbing the layer with a cotton swab or wood splint in the presence of hot nitric acid solution. After the thermally conductive adhesive layer 34 is removed, the package 10 is again rinsed with acetone, blown dry with nitrogen, soaked in water, and blown dry again. The resulting package 10 is shown in FIG. 6 as being oriented with the upper surface of chip 12 exposed. Device package 10 and chip 12 are now ready for failure analysis and reliability testing.

Some tests were performed to determine if exposing the underfill material of a device package to 70% nitric acid causes degradation of the underfill material. A first device package similar to the one shown in FIG. 4 was assembled without the heat spreader. A second device package was assembled which included the heat spreader. An automated acid dispensing system was used to subject the undersides of both device packages to a 70% solution of nitric acid at 80° C. for 5 minutes (the time necessary to etch through a heat spreader having a thickness of 0.5 mm). Both device packages were then analyzed using Acoustic microscopy before and after being exposed to the nitric acid solution. No degradation to the underfill material was observed, and the underfill material of both packages exhibited good adhesion before and after being exposed to the acid solution.

It will be appreciated to those skilled in the art having the benefit of this disclosure that this invention is believed to provide a method for obtaining access to an integrated circuit chip encapsulated within a device package so that the chip may be tested for quality and reliability. Further modifications and alternative embodiments of various aspects of the invention will be apparent to those skilled in the art in view of this description. The device package described herein is only exemplary of the type of device package to which the method of the present invention may be applied. The present invention may be used in conjunction with device packages having different elements and configurations than the device package described herein. It is intended that the following claims be interpreted to embrace all such modifications and changes and, accordingly, the specification and drawings are to be regarded in an illustrative rather than a restrictive sense.

What is claimed is:

1. A method for exposing an integrated circuit housed in a package, comprising:

providing a substrate comprising a plurality of dielectrically spaced contacts electrically coupled to said integrated circuit and terminating upon a surface of said substrate, and providing a thermally conductive heat spreader attached to said integrated circuit;

arranging a masking material adjacent to an exposed horizontal surface of said heat spreader such that a cavity extending through said masking material is aligned to said integrated circuit; and forwarding a heat spreader etchant through a conduit to said cavity and upon an exposed portion of the horizontal surface of said heat spreader to remove a portion of said heat spreader which extends vertically through said heat spreader.

2. The method of claim 1, wherein said thermally conductive heat spreader comprises copper plated with nickel.

3. The method of claim 2, wherein said heat spreader etchant comprises a solution of nitric acid.

4. The method of claim 2, wherein said heat spreader etchant comprises an aqueous solution of 70% nitric acid or greater than 70% nitric acid.

5. The method of claim 2, where in said heat spreader etchant comprises a copper etching compound selected from the group consisting of nitric acid, ferric chloride, water, and mixtures thereof.

6. The method of claim 2, wherein said heat spreader etchant comprises a nickel etching compound selected from the group consisting of nitric acid, acetic acid, hydrochloric acid, ferric chloride, water, and mixtures thereof.

7. The method of claim 1, wherein said masking material inhibits said heat spreader etchant from contacting portions of said heat spreader positioned adjacent to said masking material.

8. The method of claim 1, wherein said masking material comprises neoprene rubber.

9. The method of claim 1, wherein said masking material comprises a thickness of 2 to 4 mm.

10. The method of claim 1, further comprising positioning an etch injection block directly adjacent to said masking material prior to the step of forwarding said heat spreader etchant, wherein said conduit passes through said etch injector block, and wherein said block is positioned such that said conduit terminates at said cavity.

11. The method of claim 1, further comprising heating said heat spreader etchant prior to the step of forwarding said heat spreader etchant through said conduit.

12. The method of claim 4, further comprising heating said heat spreader etchant to a temperature of approximately 80° C. prior to the step of forwarding said heat spreader etchant.

13. The method of claim 12, wherein the step of forwarding said heat spreader etchant comprises pumping said heat spreader etchant through said conduit at a rate of about 3 microliters per minute.

14. The method of claim 1, further comprising providing a thermally conductive layer interposed between said heat spreader and said integrated circuit.

15. The method of claim 14, wherein said portion of the heat spreader is removed down to said thermally conductive layer.

16. The method of claim 15, further comprising abrading said adhesive layer while forwarding said heat spreader etchant upon said thermally conductive layer to remove said thermally conductive layer, thereby exposing said integrated circuit.

17. The method of claim 1, wherein said integrated circuit comprises input/output (I/O) pads arranged upon a lower surface of said integrated circuit, said I/O pads being coupled to said plurality of contacts via respective solder bumps.

* * * * *